US012681542B2

(12) United States Patent (10) Patent No.: US 12,681,542 B2

Kosuga et al. (45) Date of Patent: Jul. 14, 2026

(54) MODULE MOUNTING STRUCTURE AND ELECTRONIC APPARATUS

(71) Applicant: LENOVO (SINGAPORE) PTE. LTD., Singapore (SG)

(72) Inventors: Tadashi Kosuga, Yokohama (JP); Makoto Hashikura, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 166 days.

(21) Appl. No.: 18/820,935

(22) Filed: Aug. 30, 2024

(65) Prior Publication Data

US 2025/0130611 A1 Apr. 24, 2025

(30) Foreign Application Priority Data

Oct. 24, 2023 (JP) ................................. 2023-182638

(51) Int. Cl.
| | |
|---|---|
| *G06F 1/16* | (2006.01) |
| *H05K 5/00* | (2025.01) |
| *H05K 7/00* | (2006.01) |
| *H05K 7/14* | (2006.01) |
| *G11C 5/04* | (2006.01) |

(52) U.S. Cl.
CPC ......... *G06F 1/1658* (2013.01); *H05K 7/1431* (2013.01); *G11C 5/04* (2013.01)

(58) Field of Classification Search
CPC ...... G06F 1/1658; G06F 1/1656; G06F 1/166; G06F 1/1633; H05K 7/1431; H05K 7/1429; H05K 7/1427; H05K 7/1435; G11C 5/04
See application file for complete search history.

(56) References Cited

U.S. PATENT DOCUMENTS

| | | | | |
|---|---|---|---|---|
| 6,278,610 B1 * | 8/2001 | Yasufuku | ............... | H01R 12/88 |
| | | | | 361/755 |
| 6,297,966 B1 * | 10/2001 | Lee | ....................... | H10W 42/20 |
| | | | | 361/728 |
| 6,381,140 B1 * | 4/2002 | Liao | ....................... | H05K 1/144 |
| | | | | 361/721 |
| 7,365,985 B1 * | 4/2008 | Ni | ........................ | H10W 40/70 |
| | | | | 361/728 |

(Continued)

FOREIGN PATENT DOCUMENTS

JP 6-31082 U 4/1994

OTHER PUBLICATIONS

EP Search Report, application No. 24195460.1, dated Jan. 30, 2025.

*Primary Examiner* — Anthony M Haughton
(74) *Attorney, Agent, or Firm* — SHIMOKAJI IP

(57) ABSTRACT

A module mounting structure includes: a cover that covers a front surface of a memory module on which a memory chip is mounted; a relay connector board that is located between a rear side of a part of the memory module where the memory chip is mounted and a substrate, and brings a large number of contact portions of the memory module and a large number of contact portions of the substrate into contact with each other by a large number of elastic pins; and a screw that fastens the cover, a module board of the memory module, the relay connector board, and the substrate in a Z direction. The cover includes a board support protruding portion that protrudes toward the substrate and abuts on the module board along the memory chip.

13 Claims, 11 Drawing Sheets

(56)     References Cited

U.S. PATENT DOCUMENTS

| | | | |
|---|---|---|---|
| 9,329,643 B2 * | 5/2016 | Tobias | G06F 1/20 |
| 2005/0141199 A1 * | 6/2005 | Chiou | H10W 40/226 |
| | | | 257/E23.083 |
| 2007/0096181 A1 * | 5/2007 | Lien | H05K 1/147 |
| | | | 257/296 |
| 2009/0168356 A1 * | 7/2009 | Chen | H10W 40/73 |
| | | | 361/709 |
| 2010/0081328 A1 | 4/2010 | Polnyi | |
| 2013/0270696 A1 * | 10/2013 | Kim | H10W 74/131 |
| | | | 257/737 |
| 2017/0343198 A1 * | 11/2017 | Ning | G11C 5/04 |
| 2021/0193557 A1 | 6/2021 | Yao et al. | |
| 2021/0259135 A1 * | 8/2021 | Kim | H05K 7/20409 |
| 2022/0087019 A1 * | 3/2022 | Lien | H05K 1/111 |
| 2023/0005882 A1 | 1/2023 | Vergis et al. | |
| 2023/0007775 A1 | 1/2023 | Li et al. | |

* cited by examiner

MODULE MOUNTING STRUCTURE AND ELECTRONIC APPARATUS

BACKGROUND OF THE INVENTION

Field of the Invention

The present invention relates to a module mounting structure in which a module including a module board and chips on the module board is mounted on a substrate, and an electronic apparatus in which a module including a module board and chips on the module board is mounted on a substrate.

Description of the Related Art

In some electronic apparatuses, a module including a module board and chips on the module board is mounted on a substrate. An example of the module is a memory module. The module is preferably replaceable in order to improve performance or in the event of a failure. In the structure described in the specification of U.S. Patent Application Publication No. 2023/309227, a relay connector board including a plurality of elastic pins is provided between a memory module and a substrate, and a large number of contact portions on the rear surface of the memory module and a large number of contact portions on the front surface of the substrate are connected to each other by the elastic pins. In this structure, a large number of contact portions can be provided over a relatively wide area on the rear surface of the module. In this example, the memory module, the relay connector board, and the substrate are stacked and fastened with a plurality of screws and nuts, and the memory module can be removed from the substrate and replaced by removing these screws and nuts.

SUMMARY OF THE INVENTION

The memory module in the specification of U.S. Patent Application Publication No. 2023/309227 has poor area efficiency because the memory chips and the relay connector board differ in attachment position. Area efficiency can be improved if the relay connector board is located on the rear side of the part of the memory module where the memory chips are mounted. However, since the relay connector board has a large number of elastic pins, for example, fastening both ends of the relay connector board with screws may cause the center part to be pushed up by these elastic pins and cause the module board to bend so as to warp. This is likely to impose stress on the chips on the front surface of the module board.

In view of the foregoing problem, the present invention has an object of providing a module mounting structure and electronic apparatus that have good area efficiency and do not impose stress on chips.

In order to solve the foregoing problem and achieve the stated object, a module mounting structure according to a first aspect of the present invention is a module mounting structure in which a module including a module board and a chip on the module board is mounted on a substrate, the module mounting structure including: a cover that covers a front surface of the module on which the chip is mounted; a relay connector board that is located between a rear side of a part of the module where the chip is mounted and the substrate, and brings a large number of contact portions of the module and a large number of contact portions of the substrate into contact with each other by a large number of elastic pins; and a fastening member that fastens the cover, the module board, the relay connector board, and the substrate that are in a stacked state, in a stacking direction, wherein the cover includes a board support protruding portion that protrudes toward the substrate and abuts on the module board at a position along the chip.

An electronic apparatus according to a second aspect of the present invention is an electronic apparatus in which a module including a module board and a chip on the module board is mounted on a substrate, the electronic apparatus including: a cover that covers a front surface of the module on which the chip is mounted; a relay connector board that is located between a rear side of a part of the module where the chip is mounted and the substrate, and brings a large number of contact portions of the module and a large number of contact portions of the substrate into contact with each other by a large number of elastic pins; and a fastening member that fastens the cover, the module board, the relay connector board, and the substrate that are in a stacked state, in a stacking direction, wherein the cover includes a board support protruding portion that protrudes toward the substrate and abuts on the module board along a periphery of the chip.

The above-described aspects of the present invention achieve good area efficiency and do not impose stress on chips.

DETAILED DESCRIPTION OF THE INVENTION

Examples of a module mounting structure and electronic apparatus according to an embodiment of the present invention will be described in detail below, with reference to the drawings. The present invention is not limited to such examples.

Figure 1:
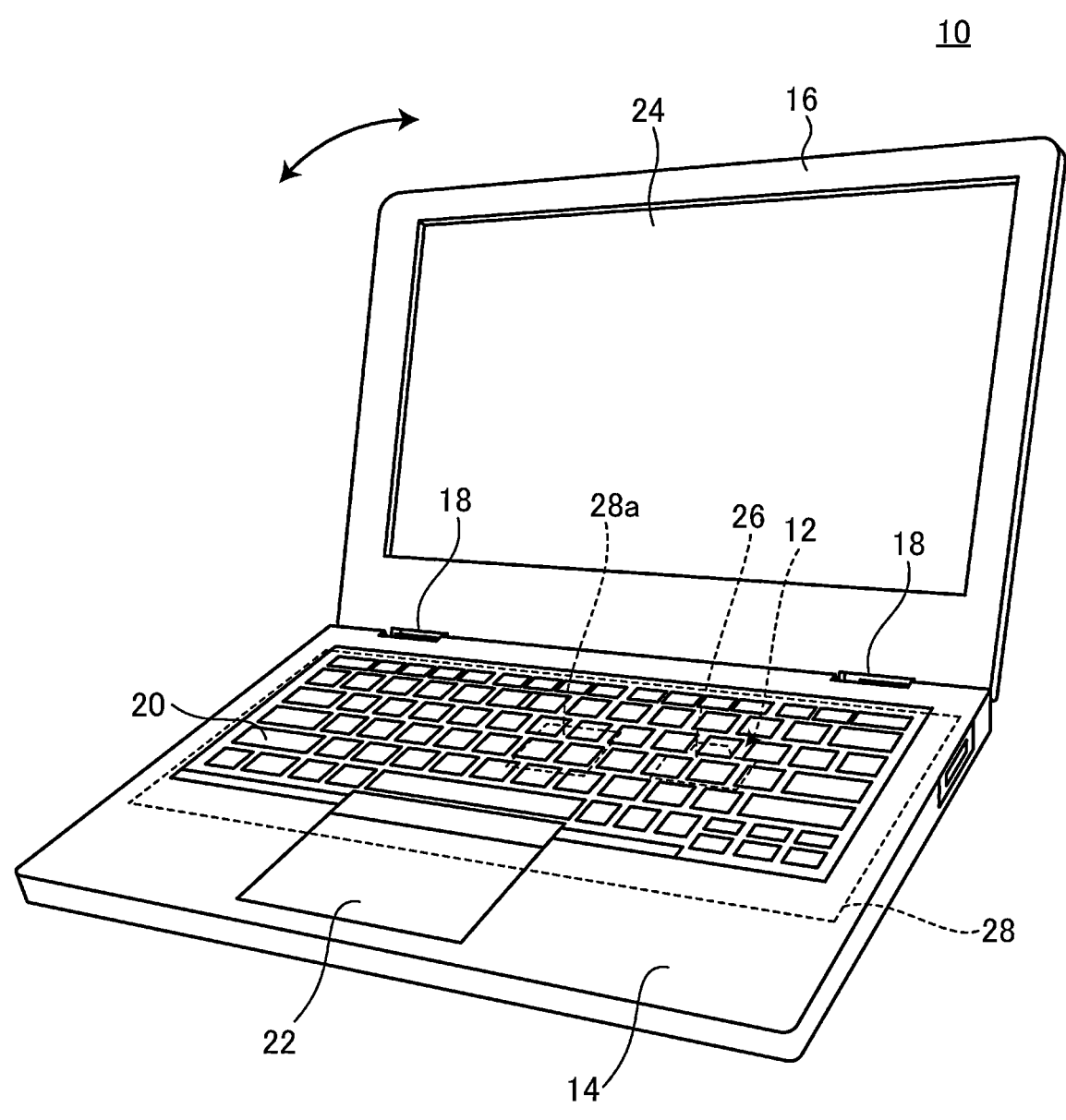
FIG. 1 is a perspective view of a laptop PC which is an electronic apparatus according to an embodiment of the present invention.

FIG. 1 is a perspective view of a laptop PC 10 which is an electronic apparatus according to an embodiment of the present invention. The laptop PC 10 includes a module mounting structure 12 according to the embodiment of the present invention. The module mounting structure 12 is incorporated inside a chassis 14 of the laptop PC 10. The electronic apparatus according to the present invention is not limited to the laptop PC 10, and may be, for example, a desktop PC or a mobile tablet terminal.

The laptop PC 10 includes a lid 16 that can be opened and closed relative to the chassis 14 by hinges 18. Closing the lid 16 makes the laptop PC 10 compact, which is suitable for mobile use.

The chassis 14 is provided with a keyboard device 20 and a touch pad 22. The front of the lid 16 is provided with a display device 24 which occupies most of its area, and a speaker and a camera (not illustrated).

The module mounting structure 12 is incorporated inside the chassis 14. The module mounting structure 12 includes a memory module 26 and a substrate 28. The substrate 28 is a main substrate in the laptop PC 10, and is provided inside the chassis 14 approximately across the left and right ends. A CPU 28a that controls the entire laptop PC 10 is mounted on the substrate 28.

Figure 2:
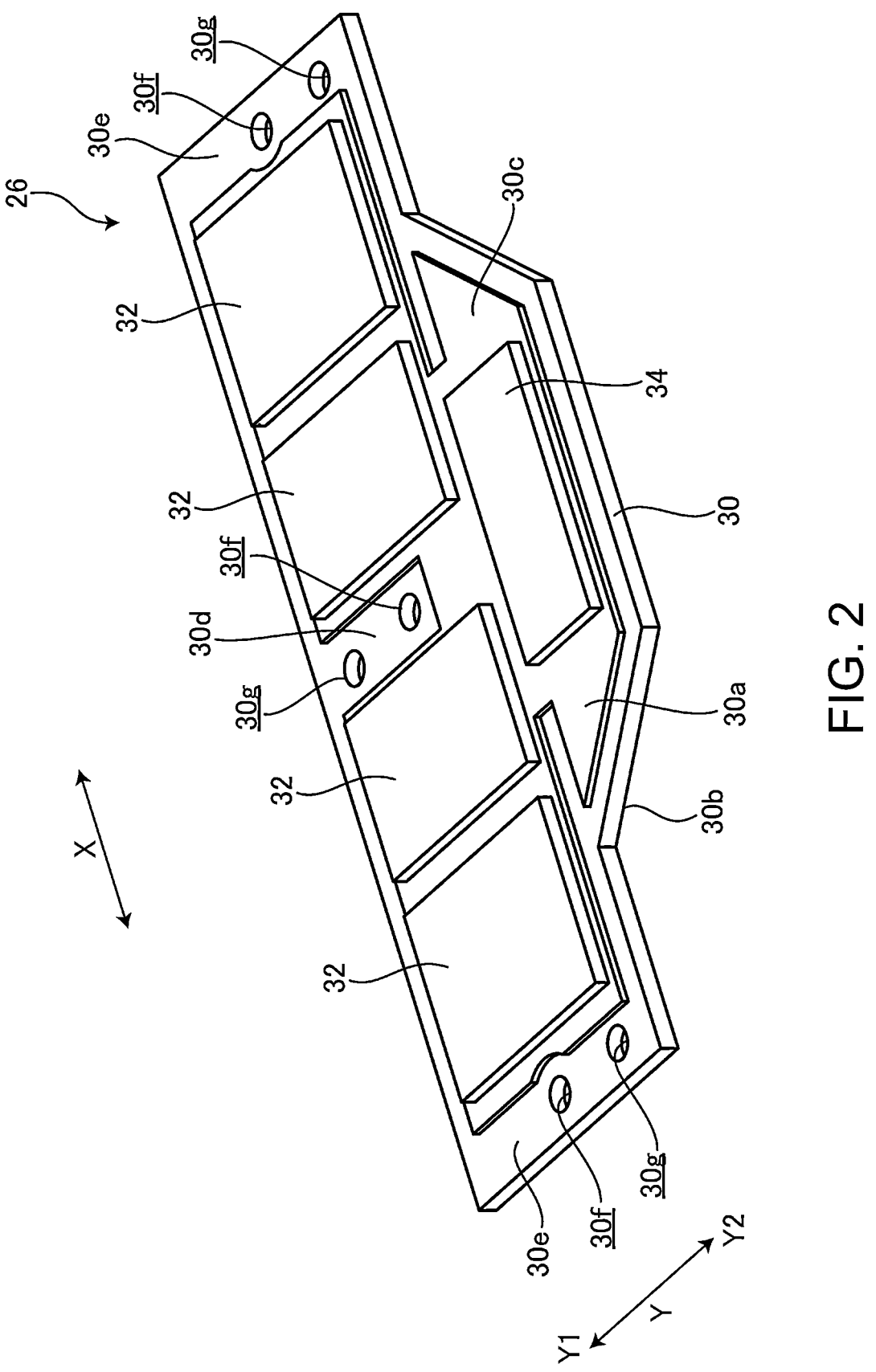
FIG. 2 is a perspective view of a memory module.

FIG. 2 is a perspective view of the memory module 26. In the memory module 26, four memory chips 32 and a power chip 34 are mounted on a PCB module board 30. The memory module 26 is, for example, compliant with Compression Attached Memory Module (CAMM). The CPU 28a reads and writes data from and to the memory chips 32. The present invention is also applicable to modules (such as SSD) other than the memory module 26 and to semiconductor chips (such as CPU) other than the memory chips 32.

The module board 30 has a front surface 30a on which the memory chips 32 and the power chip 34 are mounted, and a rear surface 30b opposite to the front surface 30a. The module board 30 is long in the X direction and short in the Y direction, and has, on one of its long sides, a trapezoidal bulging portion 30c on which the power chip 34 is mounted. The X direction, the Y direction, and the below-described Z direction are orthogonal to each other.

The four memory chips 32 are each approximately square, and are arranged linearly in the X direction. The memory chips 32 are adjacent to each other in pairs, and a center screw space 30d is secured between the pairs of memory chips 32. End screw spaces 30e are secured at both ends of the module board 30 in the X direction. A stud hole 30f is formed at approximately the center of each of the center screw space 30d and the end screw spaces 30e in the Y direction. The width of each of the center screw space 30d and the end screw spaces 30e in the X direction is about 3 times to 5 times that of the stud hole 30f. A stud 44a and a screw 46 (described later) are inserted into the stud hole 30f. In other words, each pair of memory chips 32 are interposed between screws 46 on both sides in the X direction.

A pin hole 30g is formed in the center screw space 30d on the side (hereafter also referred to as "Y1 side") opposite to the bulging portion 30c nd in each end screw space 30e on the side (hereafter also referred to as "Y2 side") near the bulging portion 30c. The width of the module board 30 in the Y direction excluding the bulging portion 30c is slightly larger than that of the memory chip 32. A large number of contact portions 30h (see FIG. 9) are arranged in a matrix on the rear surface 30b of the module board 30. The number of contact portions 30h is 600 or more in this example. The contact portions 30h are mostly located on the rear side of the memory chips 32. The module board 30 thus has good area efficiency with almost no wasted space on the front surface 30a and the rear surface 30b, which contributes to downsizing of the memory module 26.

Figure 3:
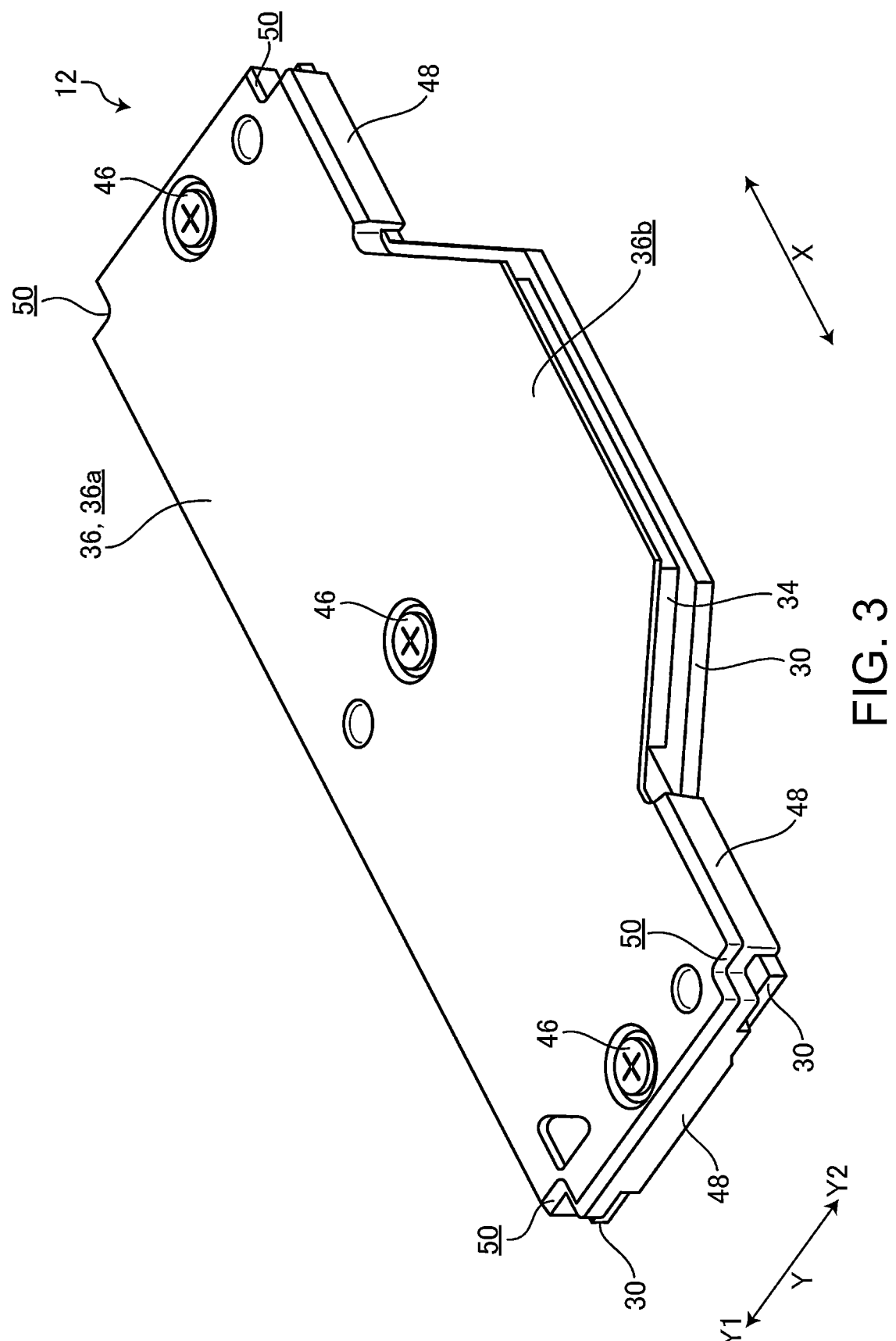
FIG. 3 is a perspective view of a module mounting structure.
Figure 4:
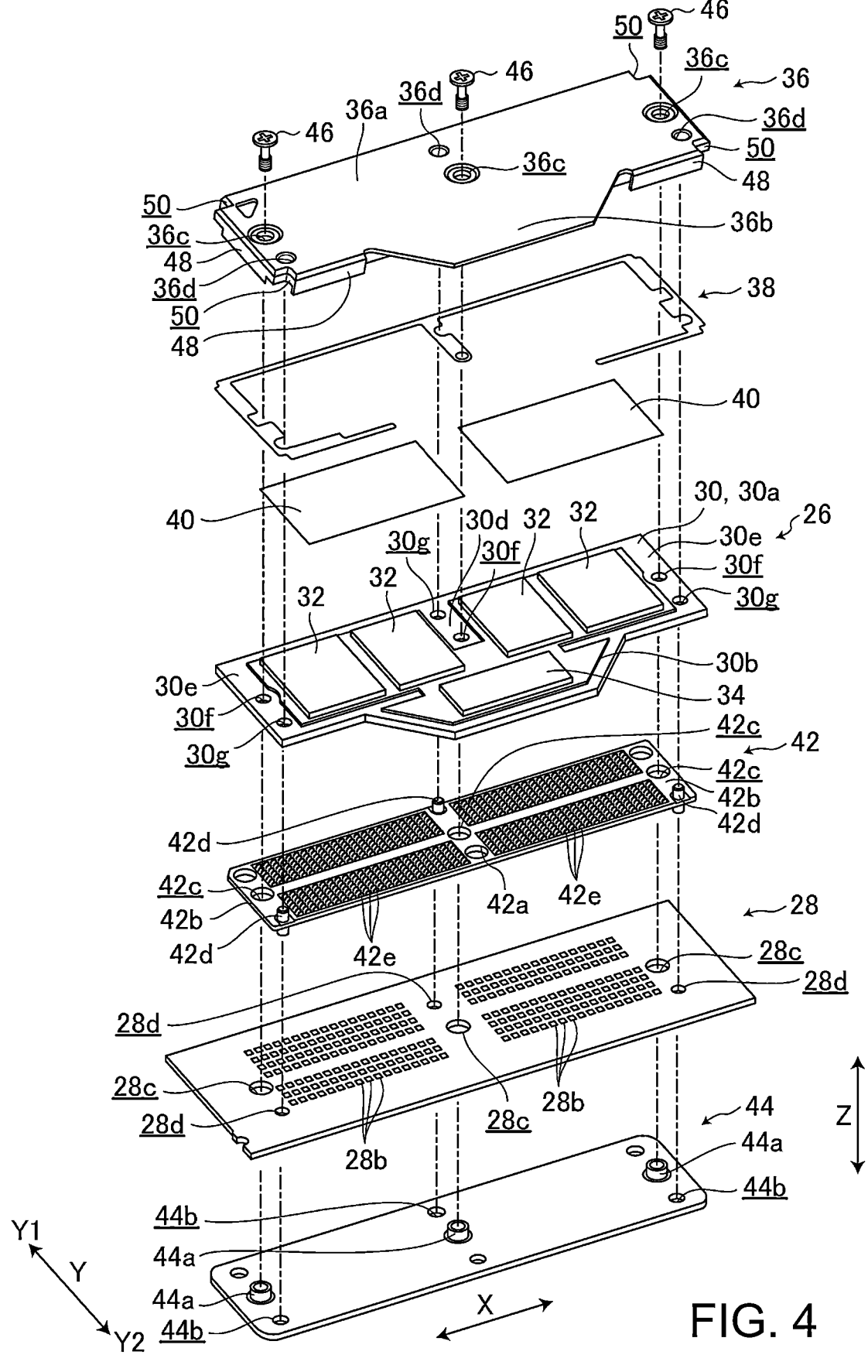
FIG. 4 is an exploded perspective view of the module mounting structure.
Figure 5:
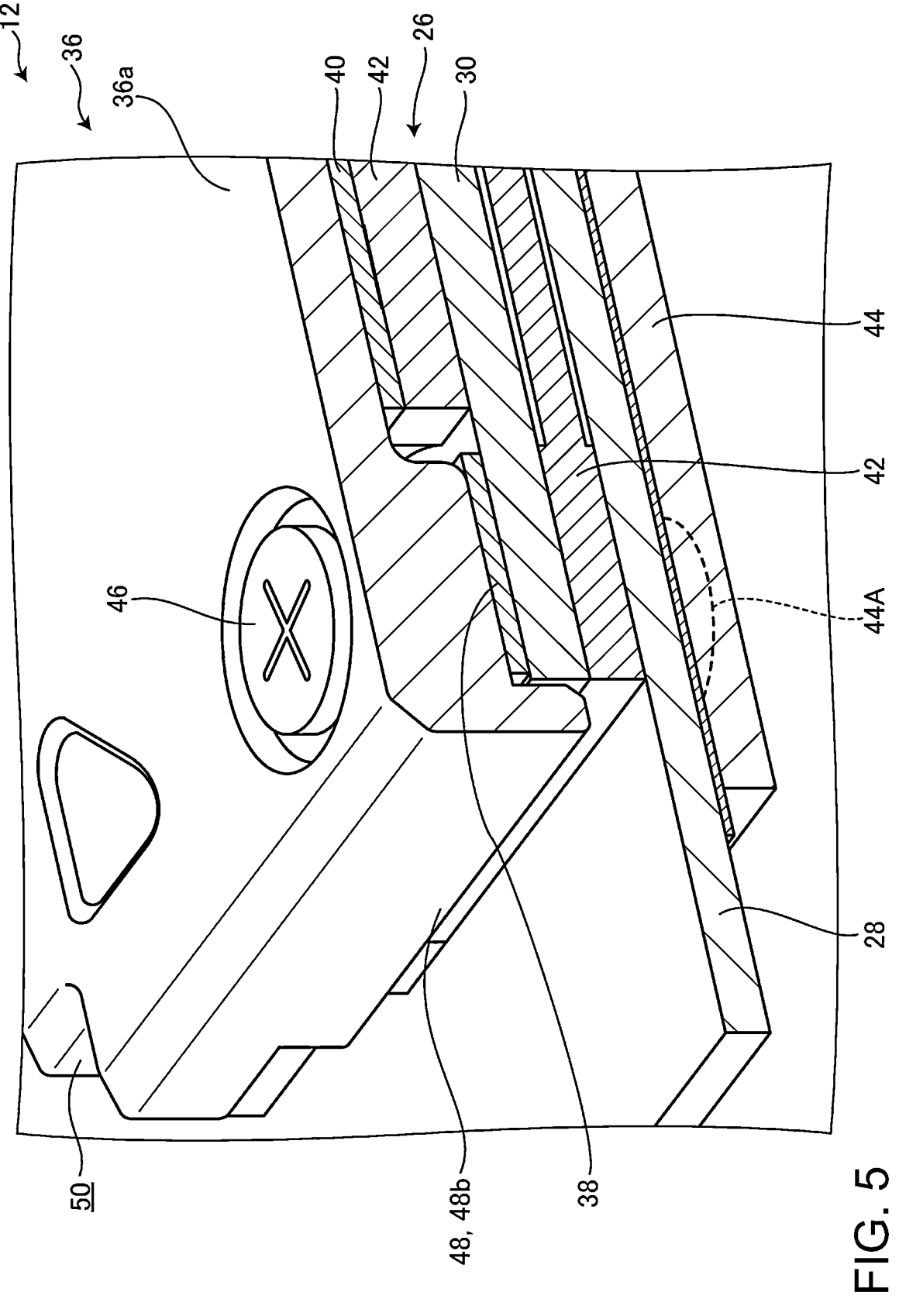
FIG. 5 is a partially enlarged sectional perspective view of the module mounting structure.
Figure 6:
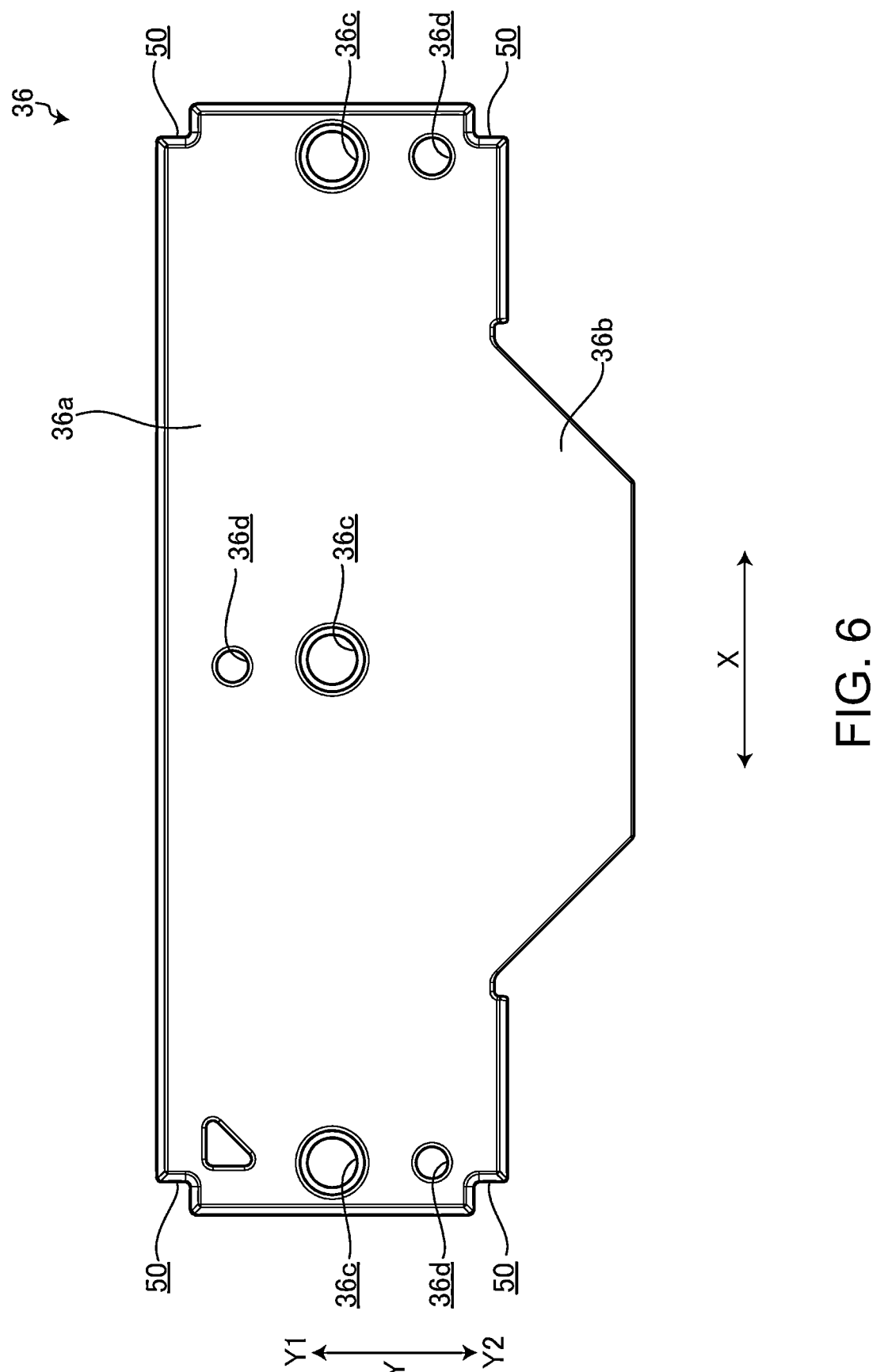
FIG. 6 is a plan view of a cover.
Figure 7:
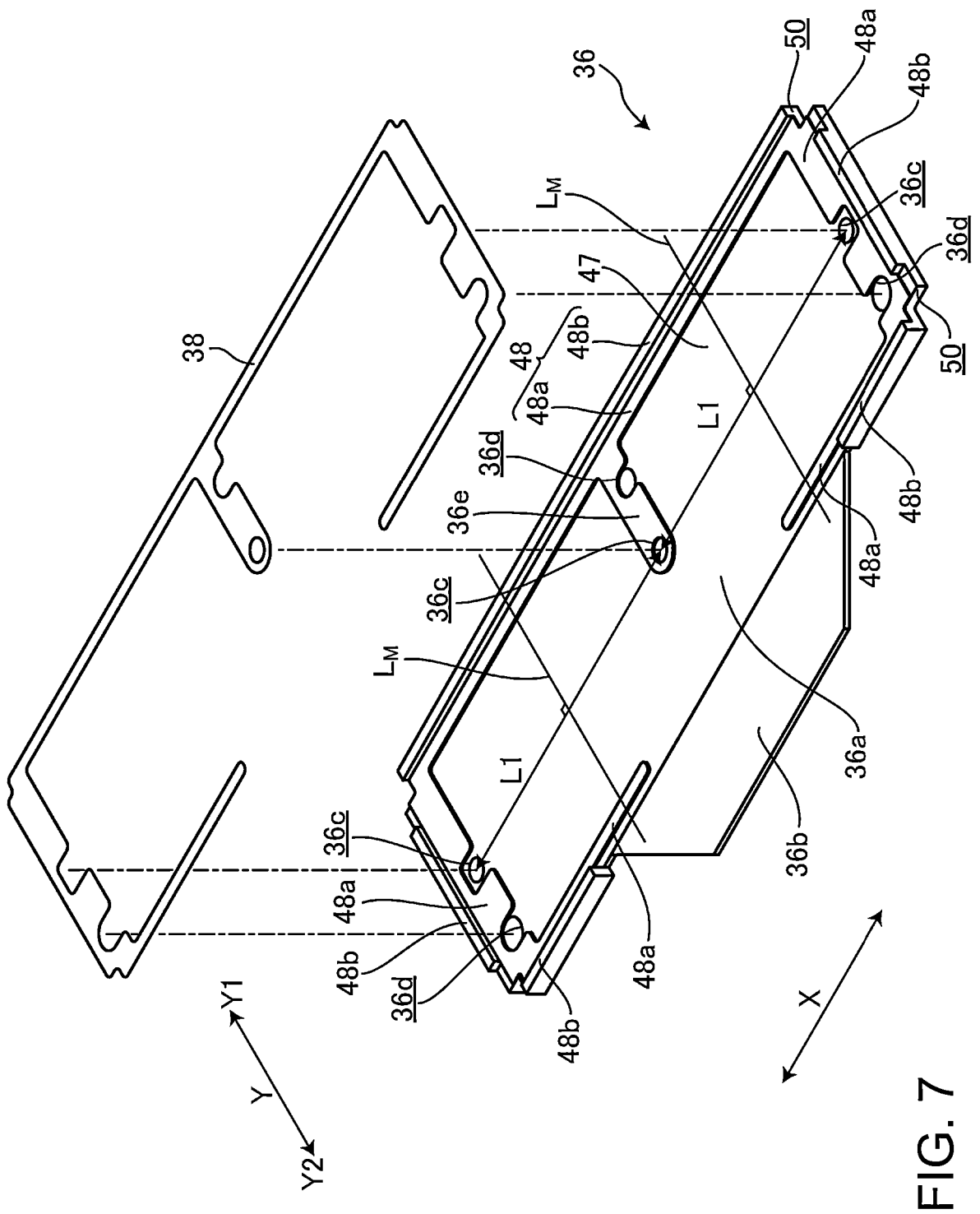
FIG. 7 is a perspective view of the cover as seen from the rear.

FIG. 3 is a perspective view of the module mounting structure 12. FIG. 4 is an exploded perspective view of the module mounting structure 12. FIG. 5 is a partially enlarged sectional perspective view of the module mounting structure 12. FIG. 6 is a plan view of a cover 36. FIG. 7 is a perspective view of the cover 36 as seen from the rear.

The module mounting structure 12 includes the cover 36, an insulating sheet (insulating material) 38, thermal interface materials (TIMs) 40, a relay connector board 42, a back plate 44, and three screws (fastening members) 46, in addition to the foregoing memory module 26 and substrate 28. In the module mounting structure 12, the cover 36, the TIMs 40, the memory module 26, the relay connector board 42, the substrate 28, and the back plate 44 that are stacked in this order in the Z direction are fastened by the screws 46.

The cover 36 covers the front surface 30a of the memory module 26 on which the memory chips 32 are mounted, and is formed by, for example, cutting or die-casting a metal material such as an aluminum material.

The cover 36 has approximately the same shape and size as the module board 30 in a plan view, and includes a rectangular portion 36a and a trapezoidal bulging portion 36b. The bulging portion 36b covers the bulging portion 30c of the module board 30, and the rectangular portion 36a covers the other parts. The bulging portion 30c is slightly thinner than the rectangular portion 36a in the Z direction. The rectangular portion 36a includes a flat portion 47 and an edge protruding portion 48. The edge protruding portion 48 protrudes from the edges of the rectangular portion 36a toward the substrate 28. The rectangular portion 36a has high rigidity and is less prone to bending or twisting because the edge protruding portion 48 is formed on its periphery. Small module check notches 50 that expose the four corners of the module board 30 are formed at the four corners of the rectangular portion 36a of the cover 36.

The edge protruding portion 48 has a two-stage shape consisting of a board support protruding portion 48a that abuts on the front surface 30a of the module board 30 along the edges and a wall portion 48b that is outward from the board support protruding portion 48a and protrudes to the edges of the module board 30. The board support protruding portion 48a and the wall portion 48b may be separate from each other.

The board support protruding portion 48a is formed at the edges of both ends of the rectangular portion 36a in the X direction, over the entire length of the edge of the rectangular portion 36a on the Y1 side, and partially on the Y2 side so as to overlap with the bulging portion 36b to some extent. The board support protruding portion 48a further includes a portion 36e that protrudes from the edge on the Y1 side toward the Y2 side at an intermediate position in the X direction. A screw hole 36c and a pin check hole 36d are provided at each of the portion 36e and the edges of both ends in the X direction. The board support protruding portion 48a has an inward route that avoids the module check notches 50 at the four corners of the rectangular portion 36a. The board support protruding portion 48a is conceptually shaped as a combination of a square C letter shape and an E letter shape. The screw hole 36c and the pin check hole 36d are located at positions corresponding to the stud hole 30f and pin hole 30g.

The wall portion 48b is square C-shaped except for the boundary between the rectangular portion 36a and the bulging portion 36b. The wall portion 48b is conceptually shaped as a square C, but is discontinuous at the module check notches 50 at the four corners of the rectangular portion 36a.

The board support protruding portion 48*a* abuts on the module board 30 via the insulating sheet 38, along each of the four memory chips 32 and also around (i.e. in a state of surrounding) the four memory chips 32. The board support protruding portion 48*a* is discontinuous at the bulging portion 36*b* so as not to impose a load on the wiring pattern between the memory chips 32 and the power chip 34. The board support protruding portion 48*a* has an appropriate width so as not to impose a local load on the module board 30. The insulating sheet 38 has the same shape as the board support protruding portion 48*a*, and is attached to the board support protruding portion 48*a*. The insulating sheet 38 has holes and notches corresponding to the stud holes 30*f* and pin holes 30*g*. The insulating sheet 38 provided between the board support protruding portion 48*a* and the module board 30 prevents short circuits in the patterns of the module board 30.

The wall portion 48*b* protrudes beyond the edges of the module board 30 but does not abut on the substrate 28 (see FIG. 5). The wall portion 48*b* abuts on the edges of the module board 30 to position the cover 36. The wall portion 48*b* is thinner than the board support protruding portion 48*a*. In this example, the wall portion 48*b* is about ⅓ of the board support protruding portion 48*a* in thickness.

The memory chips 32 have little electromagnetic leakage because the cover 36 is located above the memory chips 32, the edge protruding portion 48 covers substantially the entire sides of the memory chips 32, and the back plate 44 is located below the memory chips 32 with the substrate 28 and the like therebetween.

The TIMs 40 are provided between the cover 36 and the memory chips 32, to transfer heat from the memory chips 32 to the cover 36 and dissipate the heat. There are two TIMs 40 corresponding to the respective pairs of adjacent memory chips 32. For example, the TIMs 40 are thermally conductive sheets. In order to improve the heat dissipation effect, the area of the cover 36 may be increased or the cover 36 may be in thermal contact with another thermally conductive material. The TIMs 40 may be omitted if there is no need to dissipate heat from the memory chips 32.

Figure 8:
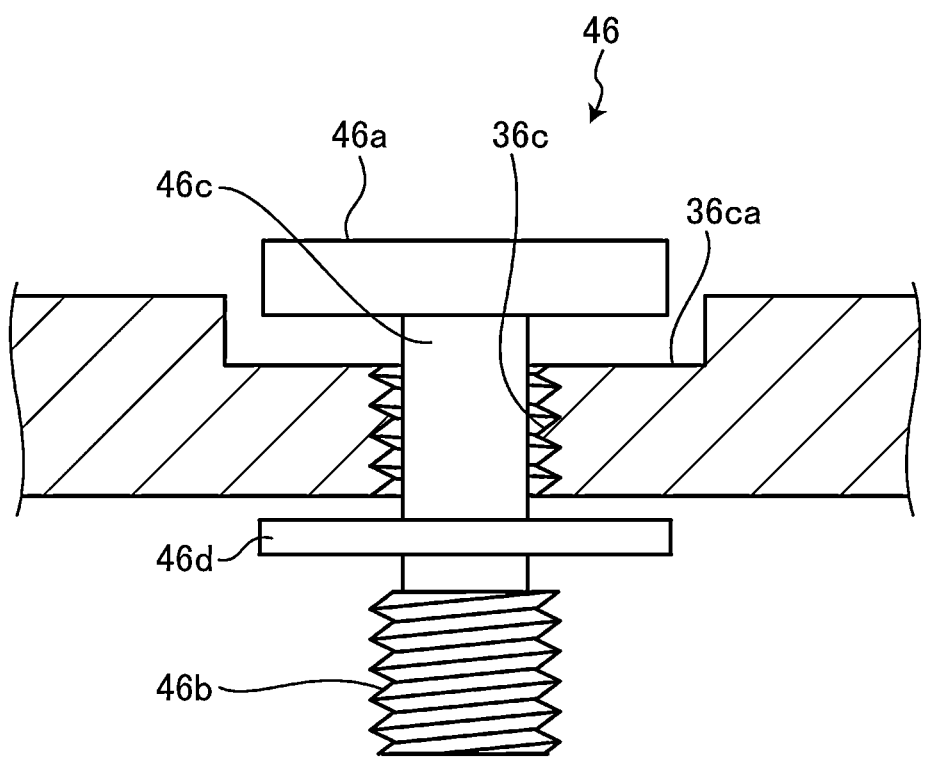
FIG. 8 is a schematic sectional view illustrating a screw hole and a screw provided in the screw hole.

FIG. 8 is a schematic sectional view illustrating a screw hole 36*c* and a screw 46 provided in the screw hole 36*c*. A spot facing 36*ca* is formed around the screw hole 36*c*. The screw 46 is a captive screw, and has a neck portion 46*c* between a head portion 46*a* and a threaded portion 46*b*. Once the threaded portion 46*b* has been screwed into and penetrates the female threaded portion of the screw hole 36*c*, the screw 46 cannot be removed unless it is rotated in the reverse direction. Hence, the screw 46 is basically kept from falling off. It is thus possible to prevent the screw 46 from being lost and from causing a short circuit on the substrate 28, etc. The neck portion 46*c* is provided with a washer 46*d*.

Returning to FIG. 4, the relay connector board 42 is shaped as a rectangle slightly smaller than the rectangular portion 36*a* of the module board 30. The relay connector board 42 is provided between the substrate 28 and the rear side of the parts where the memory chips 42 are mounted and the center screw space 30*d* of the memory module 26. Although the relay connector board 42 is provided so as to cross the center screw space 30*d* in this example, the relay connector board 42 may be divided into two parts, one on the left and one on the right, with the center screw space 30*d* as the boundary. The relay connector board 42 has a center screw space 42*a* and end screw spaces 42*b* similar to the foregoing center screw space 30*d* and end screw spaces 30*e*, and a stud hole 42*c* is formed in each of the center screw space 42*a* and the end screw spaces 42*b*. Moreover, a positioning pin 42*d* protruding upward and downward is provided in each of the center screw space 42*a* and the end screw spaces 42*b* at a position corresponding to the pin hole 30*g*.

In the relay connector board 42, a large number of elastic pins 42*e* are provided in the regions other than the center screw space 42*a* and the end screw spaces 42*b*. The elastic pins 42*e* are located at positions corresponding to the contact portions 28*b* of the substrate 28 and the contact portions 30*h* (see FIGS. 9A and 9B) of the module board 30.

The substrate 28 has the contact portions 28*b* at positions corresponding to the contact portions 30*h*. The substrate 28 has stud holes 28*c* at positions corresponding to the stud holes 30*f*, and pin holes 28*d* at positions corresponding to the pin holes 30*g*.

Figures 9A, 9B:
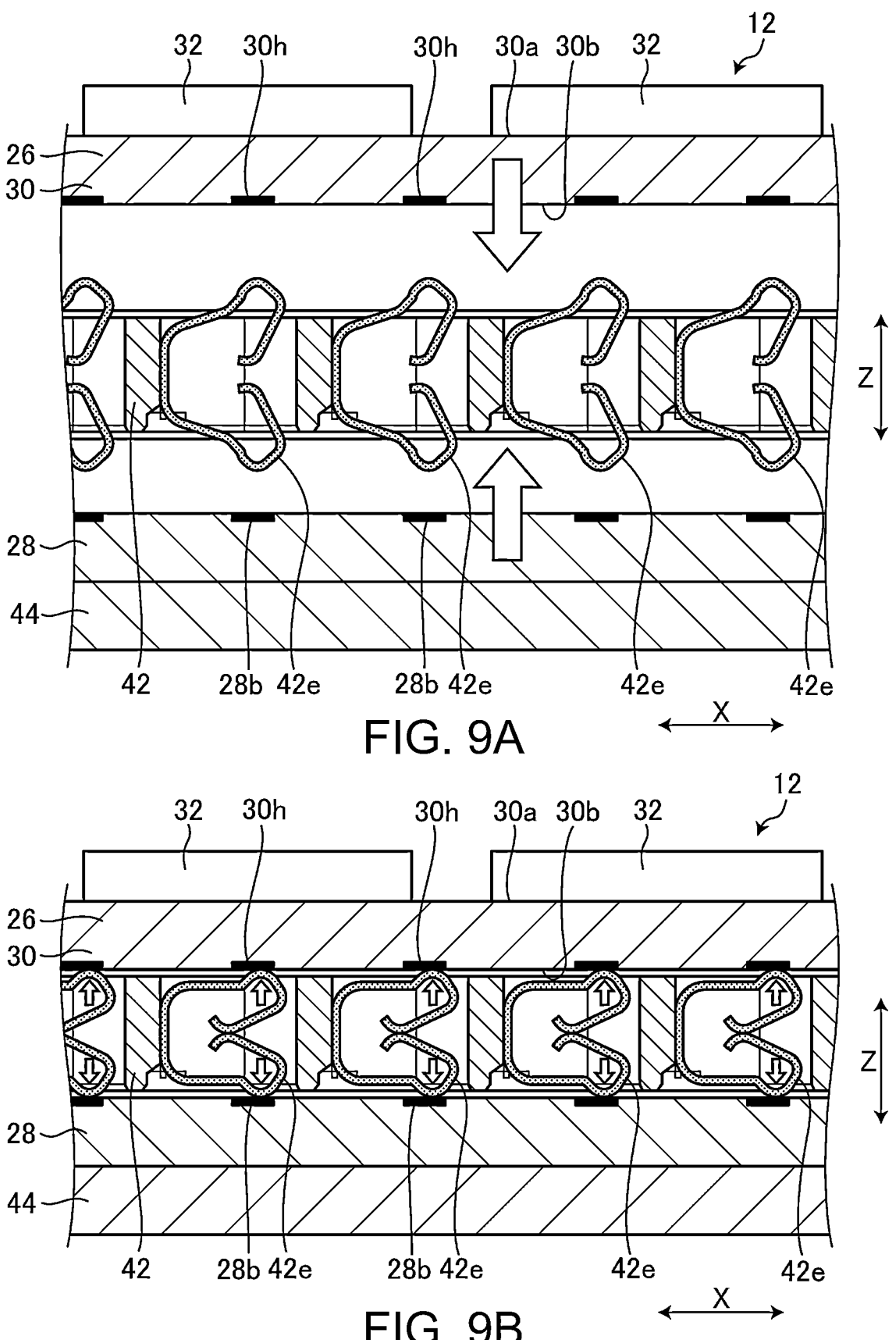
FIG. 9A is a schematic sectional view illustrating the memory module, relay connector board, substrate, and back plate before assembly.
FIG. 9B is a schematic sectional view illustrating the memory module, relay connector board, substrate, and back plate after assembly.

FIG. 9A is a schematic sectional view illustrating the memory module 26, the relay connector board 42, the substrate 28, and the back plate 44 before assembly. FIG. 9B is a schematic sectional view illustrating the memory module 26, the relay connector board 42, the substrate 28, and the back plate 44 after assembly.

As illustrated in FIG. 9A, the elastic pins 42*e* of the relay connector board 42 are roughly heart-shaped and protrude upward and downward before the module mounting structure 12 is assembled. In this stage, the upward and downward protruding parts of each elastic pin 42*e* are discontinuous and are not in contact with each other at an intermediate position therebetween.

As illustrated in FIG. 9B, after the module mounting structure 12 is assembled, the relay connector board 42 is sandwiched and pressed by the substrate 28 and the rear surface 30*b* of the module board 30. This causes the elastic pins 42*e* to be elastically compressed from above and below, as a result of which the contact portions 30*h* of the module board 30 and the contact portions 28*b* of the substrate 28 are electrically connected. In this stage, the upward and downward protruding parts of each elastic pin 42*e* come into contact with each other at the intermediate position, so that electrical resistance between the top and bottom decreases. In addition, the repulsive force exerted on the contact portions 28*b* and 30*h* increases, so that contact resistance decreases.

Returning to FIG. 4, the back plate 44 is made of a metal material, and supports the substrate 28 from the rear. The back plate 44 is shaped as a rectangle that is approximately the same as the rectangular portion 36*a* of the module board 30. An insulating sheet may be provided between the back plate 44 and the substrate 28. The back plate 44 has studs 44*a* at positions corresponding to the stud holes 30*f*, and pin holes 44*b* at positions corresponding to the pin holes 30*g*.

The upward protruding part of each of the three positioning pins 42*d* of the relay connector board 42 is fitted into the pin hole 30*g* of the module board 30 for positioning. This part can be checked through the pin check hole 36*d* of the cover 36. The downward protruding part of each of the three positioning pins 42*d* of the relay connector board 42 is fitted into the respective pin holes 28*d* and 44*b* of the substrate 28 and back plate 44 for positioning. Each stud 44*a* is fitted into the respective stud holes 28*c*, 42*c*, and 30*f* of the substrate 28, relay connector board 42, and module board 30 and screwed with the screw 46 provided in the cover 36. Thus, the cover 36, the insulating sheet 38, the TMs 40, the memory module 26, the relay connector board 42, the substrate 28, and the back plate 44 are fixed in a state of being stacked in the Z direction to form the module mounting structure 12.

Figure 10:
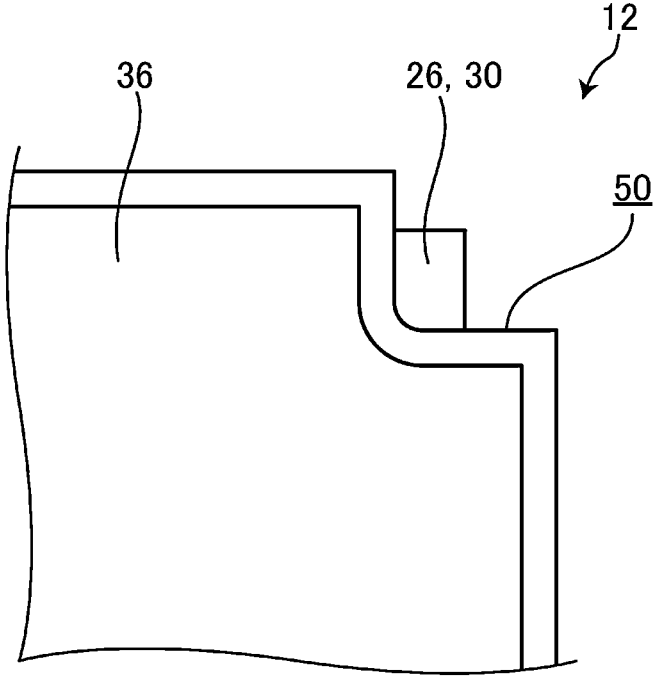
FIG. 10 is an enlarged plan view illustrating a corner of the cover.

FIG. 10 is an enlarged plan view illustrating a corner of the cover 36. In the assembled module mounting structure 12, the four corners of the module board 30 can be seen from the module check notches 50 formed at the corners of the cover 36. This makes it possible to check whether the memory module 26 is not missing and is fixed at the correct position.

Figure 11:
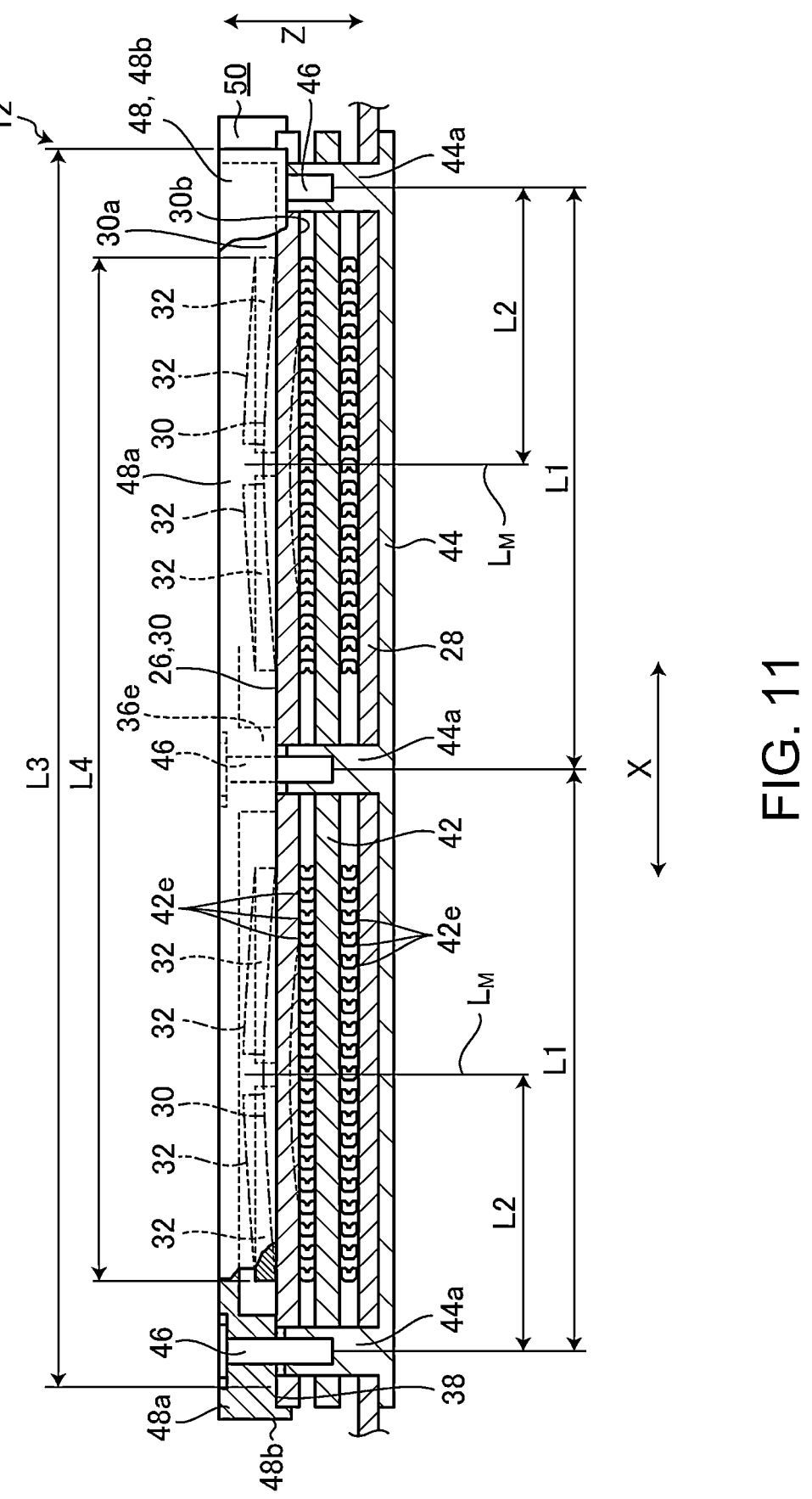
FIG. 11 is a schematic sectional view of the module mounting structure.

FIG. 11 is a schematic sectional view of the module mounting structure 12. In FIG. 11, the edge protruding portion 48 is omitted at the left end so that other parts can be seen, and is not cut at the right end to show the wall portion 48*b*. The board support protruding portion 48*a* is cut at the boundary with the wall portion 48*b*, and hatching is omitted to avoid complexity. The parts other than the edge protruding portion 48 are cut at the center in the Y direction and hatched. The TIMs 40 are omitted.

As illustrated in FIG. 11, the module board 30 is fixed as a result of the three screws 46 being screwed into the studs 44*a*, and each pair of memory chips 32 are interposed between two screws 46 on both sides and are stable accordingly. However, since the contact portions 28*b* and 30*h* are subjected to the repulsive force from the elastic pins 42*e* and, due to the elastic pins 42*e* being large in number, the force exerted on the module board 30 as a whole from the relay connector board 42 is considerably large, there is a possibility that the intermediate part between the two screws 46 warps as indicated by the imaginary lines to impose stress on the memory chips 32 on the front surface 30*a*.

In view of this, in the module mounting structure 12 and electronic apparatus 10 according to this embodiment, the board support protruding portion 48*a* of the cover 36 protrudes toward the substrate 28 and abuts on the module board 30 along the memory chips 32. The module board 30 can thus be prevented from warping to impose stress on the memory chips 32.

The board support protruding portion 48*a* may be flexibly applied depending on the arrangement of the module board 30 and the memory chips 32. In this example, the four memory chips 32 are arranged linearly in the X direction. Accordingly, the board support protruding portion 48*a* is, at least on the Y1 side (see FIG. 7), provided over a range L3 that is longer than the total length L4 of the four memory chips 32 in the X direction, so that the module board 30 can be held flat at least on the Y1 side. The range L3 is approximately the entire length of the rectangular portion 36*a* excluding the module check notches 50. Let L1 be the interval between screws 46. Then, the range L3 includes L1+L1, which is the range of three screws 46. Thus, the module board 30 can be held flat more reliably.

The module board 30 is considered to be subjected to the largest force at the midpoint of the line segment L1 connecting two screws 46, that is, at the position of the distance L2 (=L1/2) from each screw 46. It is therefore preferable that the board support protruding portion 48*a* holds the module board 30 at least at this part. In other words, the board support protruding portion 48*a* is preferably located at least at a position including the perpendicular bisector $L_M$ of the line segment L1 connecting two screws 46. As illustrated in FIG. 7, the board support protruding portion 48*a* is provided at a position including the perpendicular bisector $L_M$ on both the Y1 side and the Y2 side of the rectangular portion 36*a*.

The board support protruding portion 48*a* extends not only in the X direction but also in the Y direction, so that the module board 30 can be held flat more reliably. In particular, the board support protruding portion 48*a* is provided over the entire length in the Y direction near the memory chips 32 at both ends in the X direction, and these parts of the board support protruding portion 48*a* and the parts of the board support protruding portion 48*a* extending in the X direction are integrally connected at their ends. Hence, the parts extending in the X direction and the parts extending in the Y direction complement each other in strength, with it being possible to hold the module board 30 more reliably.

Each memory chip 32 is approximately square in most cases. When a plurality of such memory chips 32 are arranged linearly in the X direction, the total dimension L4 in the X direction is large whereas the dimension in the Y direction is relatively small. Therefore, even if design constraints or the like make it impossible to provide the board support protruding portion 48*a* on either the Y1 side or the Y2 side, providing the board support protruding portion 48*a* along the entire length of the memory chip 32 in the Y direction can prevent warping of the module board 30 appropriately. Although the substrate 28 is also subjected to a large elastic force as with the module board 30, the substrate 28 is supported by the back plate 44 and therefore is prevented from warping. In the case where the substrate 28 has sufficiently high strength, the back plate 44 may be omitted and the studs 44*a* may be provided directly on the substrate 28.

While the board support protruding portion 48*a* prevents warping of the module board 30, the flat portion 47 (see FIG. 7) of the cover 36 does not directly contribute to preventing warping of the module board 30 although it has the function of connecting the board support protruding portion 48*a* on all four sides and the function of preventing electromagnetic leakage and dissipating heat. Therefore, depending on the design conditions, the flat portion 47 does not need to cover the entire rectangular portion 36*a* and may partially expose the rectangular portion 36*a*. In the foregoing example, the pin check holes 36*d* and the module check notches 50 are exposed. The flat portion 47 may have holes that allow the model numbers and shapes of the memory chips 32 to be checked.

The present invention is not limited to the embodiment described above, and changes can be made freely without departing from the gist of the present invention.

The invention claimed is:

1. A module mounting structure in which a module including a module board and a chip on the module board is mounted on a substrate, the module mounting structure comprising:
   a cover that covers a front surface of the module on which the chip is mounted;
   a relay connector board that is between a rear side of a part of the module where the chip is mounted and the substrate, and brings contact portions of the module and contact portions of the substrate into contact with each other by elastic pins; and
   a fastening member that fastens, in a stacking direction, the cover, the module board, the relay connector board, and the substrate that are in a stacked state,
   wherein the cover includes a board support protruding portion that protrudes toward the substrate and abuts the module board at a position along the chip.

2. The module mounting structure according to claim 1, wherein the cover includes a wall portion that is outward of the board support protruding portion and protrudes to an edge of the module board.

3. The module mounting structure according to claim 2, wherein the cover is positioned by the wall portion abutting the edge of the module board.

4. The module mounting structure according to claim 1, wherein the fastening member comprises a plurality of fastening members, and wherein the chip is interposed between the plurality of fastening members.

5. The module mounting structure according to claim 4, wherein the board support protruding portion is along an entire length of a line segment connecting two fastening members of the plurality of fastening members.

6. The module mounting structure according to claim 4, wherein the board support protruding portion is at least at a position including a perpendicular bisector of a line segment connecting two fastening members of the plurality of fastening members.

7. The module mounting structure according to claim 1, wherein the chip comprises a plurality of chips that are arranged linearly, and wherein the board support protruding portion is over a total length of the plurality of chips in a linear direction, and is at least on one side of the plurality of chips.

8. The module mounting structure according to claim 1, wherein the fastening member is a captive screw, and is inserted in a screw hole of the cover so as not to fall out.

9. The module mounting structure according to claim 1, wherein the cover has a module check notch that exposes a corner of the module board.

10. The module mounting structure according to claim 1, wherein the cover is a metal material.

11. The module mounting structure according to claim 10, further comprising a thermal insulative material between the cover and the chip.

12. The module mounting structure according to claim 1, further comprising an insulating material between the board support protruding portion and the module board.

13. An electronic apparatus in which a module including a module board and a chip on the module board is mounted on a substrate, the electronic apparatus comprising:

a cover that covers a front surface of the module on which the chip is mounted;

a relay connector board that is between a rear side of a part of the module where the chip is mounted and the substrate, and brings contact portions of the module and contact portions of the substrate into contact with each other by elastic pins; and a fastening member that fastens, in a stacking direction, the cover, the module board, the relay connector board, and the substrate that are in a stacked state, wherein the cover includes a board support protruding portion that protrudes toward the substrate and abuts the module board along a periphery of the chip.

* * * * *